United States Patent
Lyon et al.

(10) Patent No.: US 8,390,454 B2
(45) Date of Patent: Mar. 5, 2013

(54) USB HOSTED SENSOR MODULE

(75) Inventors: Geoff M Lyon, Menlo Park, CA (US); Alan A McReynolds, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 551 days.

(21) Appl. No.: 12/534,028

(22) Filed: Jul. 31, 2009

(65) Prior Publication Data

US 2011/0025504 A1 Feb. 3, 2011

(51) Int. Cl.
 *G08B 13/14* (2006.01)
(52) U.S. Cl. .................. 340/572.1; 340/506; 702/188
(58) Field of Classification Search ............ 340/572.1, 340/500, 506, 531, 538, 538.15, 568.2–568.4; 702/188
See application file for complete search history.

(56) References Cited

U.S. PATENT DOCUMENTS

| | | | | |
|---|---|---|---|---|
| 6,369,706 B1* | 4/2002 | Anderson et al. | ............. | 340/506 |
| 7,135,971 B2* | 11/2006 | Kim | ........................... | 340/568.1 |
| 7,630,864 B2* | 12/2009 | Shoenfeld | ..................... | 702/188 |
| 7,986,224 B2* | 7/2011 | Joy et al. | ..................... | 340/568.2 |
| 2005/0179562 A1* | 8/2005 | Ganz et al. | ............... | 340/870.07 |
| 2007/0119960 A1* | 5/2007 | Zheng | ........................... | 236/1 R |

\* cited by examiner

*Primary Examiner* — John A Tweel, Jr.

(57) ABSTRACT

A USB hosted sensor module, comprising: a substrate; a sensor mounted on the substrate; and a USB connector extending from the substrate, the USB connector capable of electrically coupling to a USB port of a host device, the USB connector capable of drawing power from the USB port of the host device to provide electrical power to the USB hosted sensor module; and a processing device mounted on the substrate, the processor capable of supporting a first communication channel and a second communication channel, wherein the first communication channel is between the USB hosted sensor module and an external communication device, wherein the second communication channel is between the USB hosted sensor module and the host device.

14 Claims, 5 Drawing Sheets

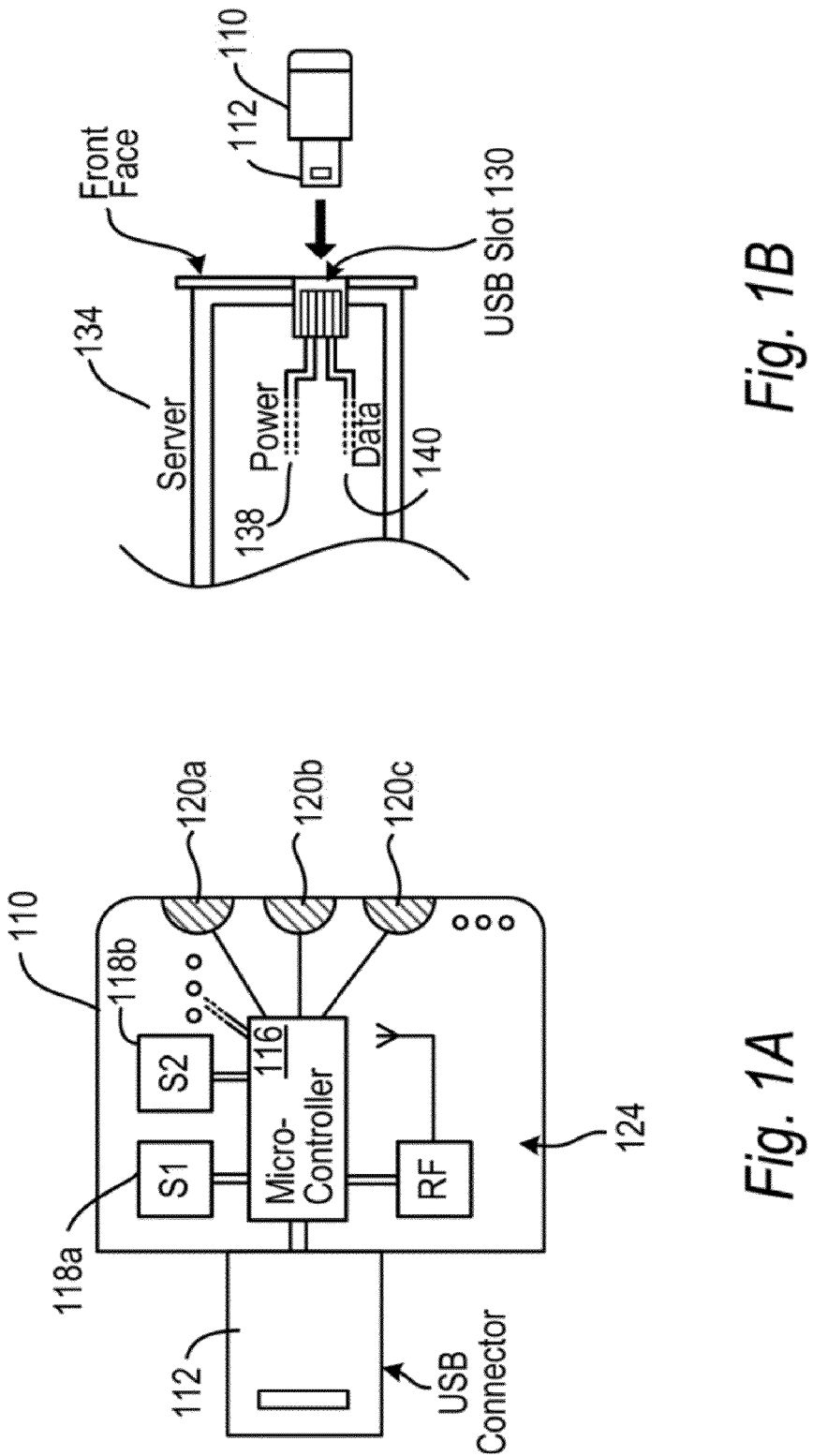

US 8,390,454 B2

USB HOSTED SENSOR MODULE

CROSS-REFERENCE TO RELATED APPLICATION

This case is related to the case "An Optical System and Method for Monitoring and Locating Objects" filed on Jul. 31, 2009, having U.S. Ser. No. 12/534,045, which is hereby incorporated by reference in its entirety.

BACKGROUND

Reducing data center cooling costs by actively controlling the cooling air circulating within the facility is a critical concern to data center administrators. To this end, technologies have been devised to adaptively cool the assets within the computer room, by portioning the level of cooling. In such cases, thermal measurements are required to provide feedback to the airflow control system and to ensure that inflow temperature conditions are being met; often a condition of asset warranties within managed facilities.

Some prior systems for measuring inlet temperature rely on an extensive overlay sensor array, or wired chains of discrete temperature systems, together with a data aggregation unit that feeds information regarding inlet and exhaust temperature readings to the cooling control system. However, the expense and complexity of wiring and configuring the solution is a significant cost. One server embeds inlet temperature sensors in the server thus providing an alternate to an overlay sensor solution. However, many recent and legacy assets do not contain inlet or exhaust sensors or a means to export such data. Devices that do have sensors often may have differing access protocols.

A further need within data center facilities is providing knowledge of individual asset locations and their operational status. Knowing the location of individual assets would enable operations staff to quickly locate a particular asset that may have been moved during a prior facilities reconfiguration. This is also a valuable assist when the facility's assets are audited, replacing a time consuming manual activity with a remotely controlled and automated alternative.

A number of indoor location technologies have been researched and developed, but their application within the data center environment remains challenging. Approaches that rely on RF signal strength (RSSI) measurement are problematic when deployed within aggressive indoor environments that contain multiple RF pathways, metallic surfaces, sources of RF noise, and which are conducive to the formation of standing wave conditions. Other developments include carrier-less RF systems (i.e. UWB) and combined RF and acoustic ranging techniques, both of which have been tested within data center-environments and need careful engineering to overcome noise related issues.

While the prior methods provide solutions to the problem of locating or monitoring assets within the data center, deployment, configuration and cost issues have prevented their widespread adoption and in some cases productization.

BRIEF DESCRIPTION OF THE DRAWINGS

The Figures depict implementations/embodiments of the invention and not the invention itself. Some embodiments of the invention are described, by way of example, with respect to the following Figures:

FIG. 1A shows a USB sensor in accordance with embodiments of the present invention.

FIG. 1B shows the USB sensor of FIG. 1A connected to a host device in accordance with embodiments of the present invention.

DETAILED DESCRIPTION

Figure 2A:
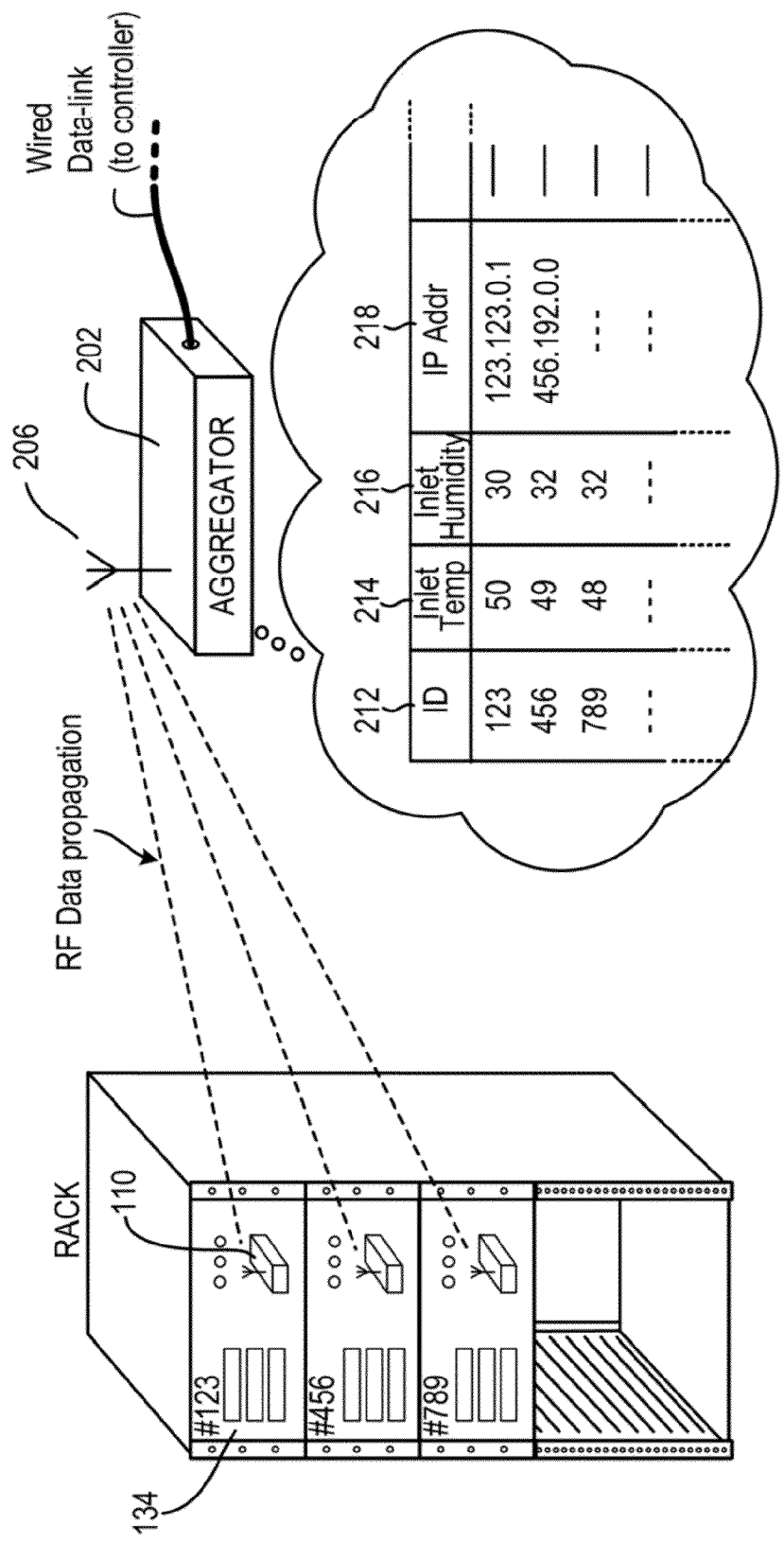
FIG. 2A shows a rack including a plurality of host devices (servers), where each server includes a USB hosted sensor module capable of RF communication in accordance with embodiments of the present invention.

The described invention addresses the need to monitor and locate computer assets under a variety of situations, primarily within the data center and where a generic collection of equipment would be deployed. By taking advantage of the universal availability of powered USB slots on such assets, we have devised a system and method to remotely monitor the environmental conditions (e.g. temperature, humidity, airflow) within the immediate vicinity of the asset, while providing a means to locate the asset. Hence, such assets placed within the data center can be autonomously identified, monitored and located.

The described invention is expected to be simpler and less expensive to deploy than current wired sensor overlay networks. Taking advantage of the inbuilt power supply and communications channel offered by the server's existing USB slots, provides a method to monitor, on a per asset basis, for example, the inlet temperature or other environmental parameters of interest from generic or un-instrumental hosts. The described invention can thus help provide data to be used in developing a thermal inlet profile for each rack without incurring additional wiring and device interconnection costs.

The present invention provides a USB hosted sensor module 110 capable of sensing environmental conditions in a data center, the USB hosted sensor module including a USB connector 112, said USB connector capable of electrically coupling to a USB port of a host device and capable of drawing power from the USB port of the host device to provide electrical power to the USB hosted sensor module, said USB hosted sensor module including at least one environmental sensor 118a-b. In one embodiment, the USB hosted sensor module includes a plurality of sensors and may optionally include light emitting and/or receiving devices 120a-c and a wireless subsystem 124. In addition, the USB hosted sensor module includes a microcontroller 116 (or other processing device). Software instructions for supporting and controlling the USB hosted sensor module are loaded for execution onto the microcontroller. The USB hosted sensor module is capable of supporting at least one communication channel between the sensor module and an external communication device. In one embodiment, the microcontroller is capable of supporting a first communication channel and a second communication channel, where the first communication channel is a communication channel between the USB hosted sensor module and an external communication device and the second communication channel is a communication channel between the USB hosted sensor module and the host device.

FIG. 1A shows a USB hosted sensor module 110 in accordance with embodiments of the present invention. The USB hosted sensor module 110 includes a USB connector 112. Through the USB connector 112, the USB hosted sensor module 110 is capable of electrically connecting to a USB port (or slot) of a host device. Through the USB connector 112, the USB hosted sensor module connects to and draws power from the host device to provide electrical power to the USB hosted sensor module. Further, the USB hosted sensor module includes a microcontroller 116 that is capable of communicating with the host device using the USB protocol. Thus in one embodiment, the USB connector 112 via the microcontroller 116 provides a communication channel between the USB hosted sensor module and the host device.

Referring to FIG. 1A, the USB hosted sensor module 110 includes a plurality of sensors 118a and 118b. Typically, the sensors are environmental sensors capable of monitoring environmental parameters of interest, for example temperature, humidity, atmospheric pressure and airflow. In one embodiment, the USB hosted sensor module 110 is plugged into the front fascia of the host device and is capable of monitoring the inlet temperature and air flow in the vicinity of the host device. In line with best practices for facilities operation, cooling air is directed to the front of the rack and is monitored by each USB hosted sensor module as it enters each asset, thus forming an array of environmental measurement points. Warmed air exits the rear of the rack for recirculation and cooling by the facilities air conditioning system.

An ever increasing majority of server and blade computing products have accessible Universal Serial Bus (USB) ports on their front fascia, or inlet side. According to USB host/hub specification, these USB ports are mandated to be capable of providing a 5 volt, 100 mA, DC power supply to any connected device, optionally supporting a device load of 500 mA via protocol negotiation. The 5 volt, 100 mA mandated power supply requirement is anticipated to be in excess of that required for the USB hosted sensor module 110 described in this application, thus allowing the sensor module to operate independent of host communications.

Referring to FIG. 1A, the USB hosted sensor module 110 as shown does not contain an internal power source but instead scavenges power from the host device. The sensor module and connector are typically supported by or connected to a substrate. Therefore, (unless there is backup power supply) the USB hosted sensor module 110 will only remain operational as long as the host device to which the sensor module 110 is connected to a power source. In order to enable to the USB hosted sensor module 110 to operate in the event of an unexpected power loss or controlled shutdown of the host device, in one embodiment the USB hosted sensor module includes an internal backup power supply (not shown). In one embodiment, the internal backup power supply is a rechargeable battery or super capacitor. Such an internal backup power supply would still provide power in the event of power loss where the sensed data might to be of particular interest to the facilities operations manager.

In one embodiment, when power is being shut down normally via a planned power-down sequence, the host device or server can send a message to the USB hosted sensor module 110, notifying the sensor module of the anticipated power shut down. But if the power interruption is unanticipated (i.e. someone accidentally pulls out the plug connected to the host device), then having a backup power supply would allow the USB hosted sensor module to flag the system administrator that an unexpected power interruption has occurred. For a USB hosted sensor module that includes light emitting and receiving devices 120a-c, information that a power interruption has occurred could be transmitted optically—say by flashing the light emitting devices so that a system administrator would know something is wrong. For a USB hosted sensor modules 110 that includes an RF transceiver (part of wireless sub-system 124), a message could be communicated to the administrator via a secondary communication channel to an external RF transceiver.

FIG. 1B shows the USB hosted sensor module 110 of FIG. 1A that is aligned to be plugged into a USB slot 130 of a host device 134 in accordance with embodiments of the present invention. Referring to FIG. 1B shows a USB hosted sensor module that includes a USB connector 112. When the USB connector 112 of the USB hosted sensor module 110 is plugged into the USB slot 130 of the host device 134 (in this case a server), power is provided to the USB hosted sensor module 110 via a power trace 138. In addition, insertion of the connector into the USB slot 130 establishes a USB wired communication channel which allows data to flow (via a data trace 140) between the USB hosted sensor module 110 and the host device 134. The data transfer between the two devices is bidirectional and according to the USB protocol specification.

In one embodiment, once connected to the host device, the USB hosted sensor module 110 obtains power for normal operations and begins telegraphing its environmental readings through the one or more of the embedded communication channels (USB, optical or RF). The USB hosted sensor module 110 does not give physical location but can combine with other data from the host device via USB link to provide a richer set of info. In addition, when plugged into a compatible host device the USB hosted sensor module may request identifying information (e.g. MAC address, IP address, make, model, serial number) from that host device. Alternatively or in addition to the identifying information, the USB hosted sensor module 110 may request other operating parameters from the host device, such as internal processor temperature or current workload information. Depending on the device's configuration, this information could be provided by the management software hosted on the host device.

Figure 2B:
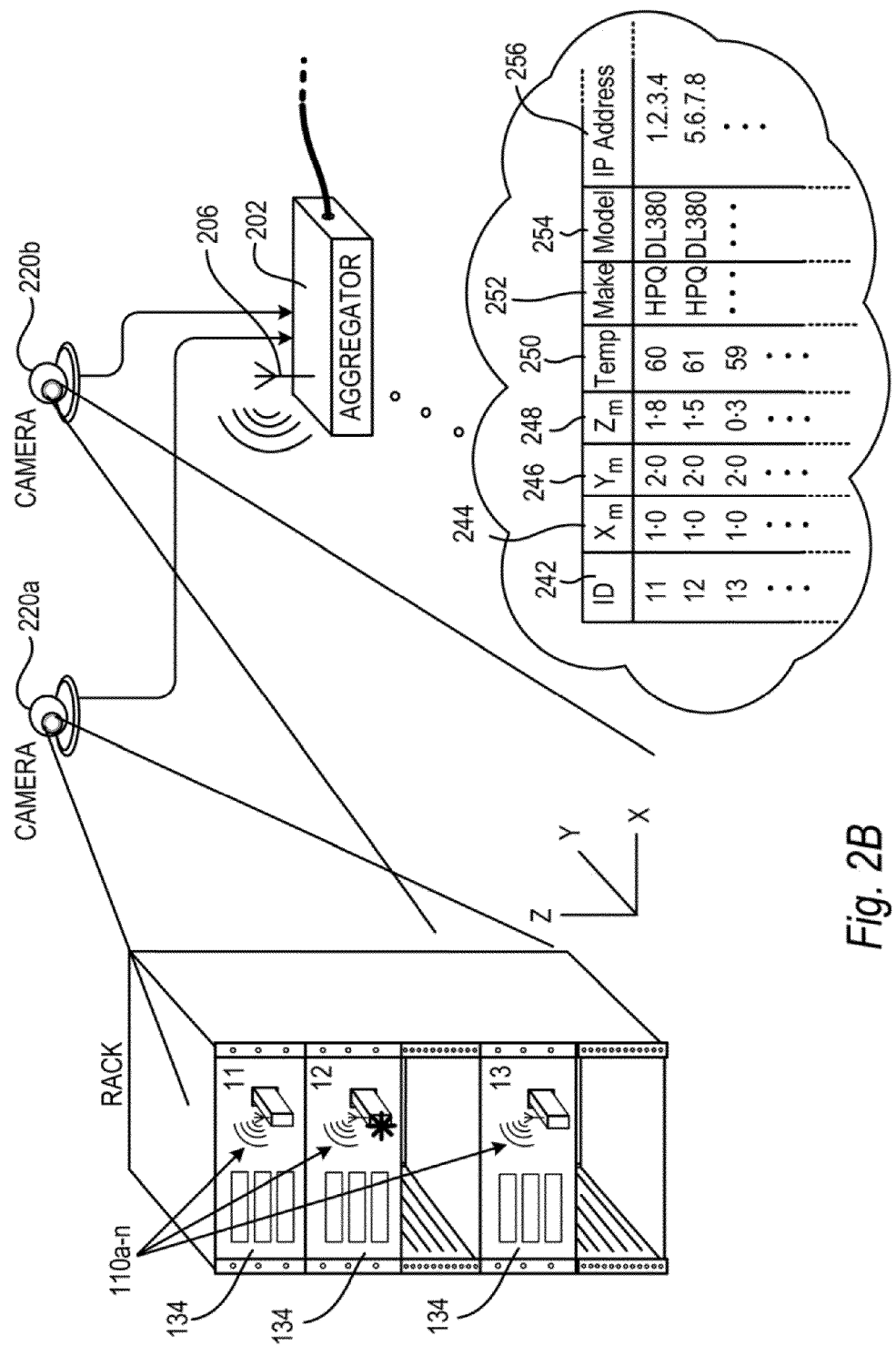
FIG. 2B shows a rack including a plurality of host devices (servers), where each server includes a USB hosted sensor module capable of optical and RF communication in accordance with embodiments of the present invention.
Figure 2C:
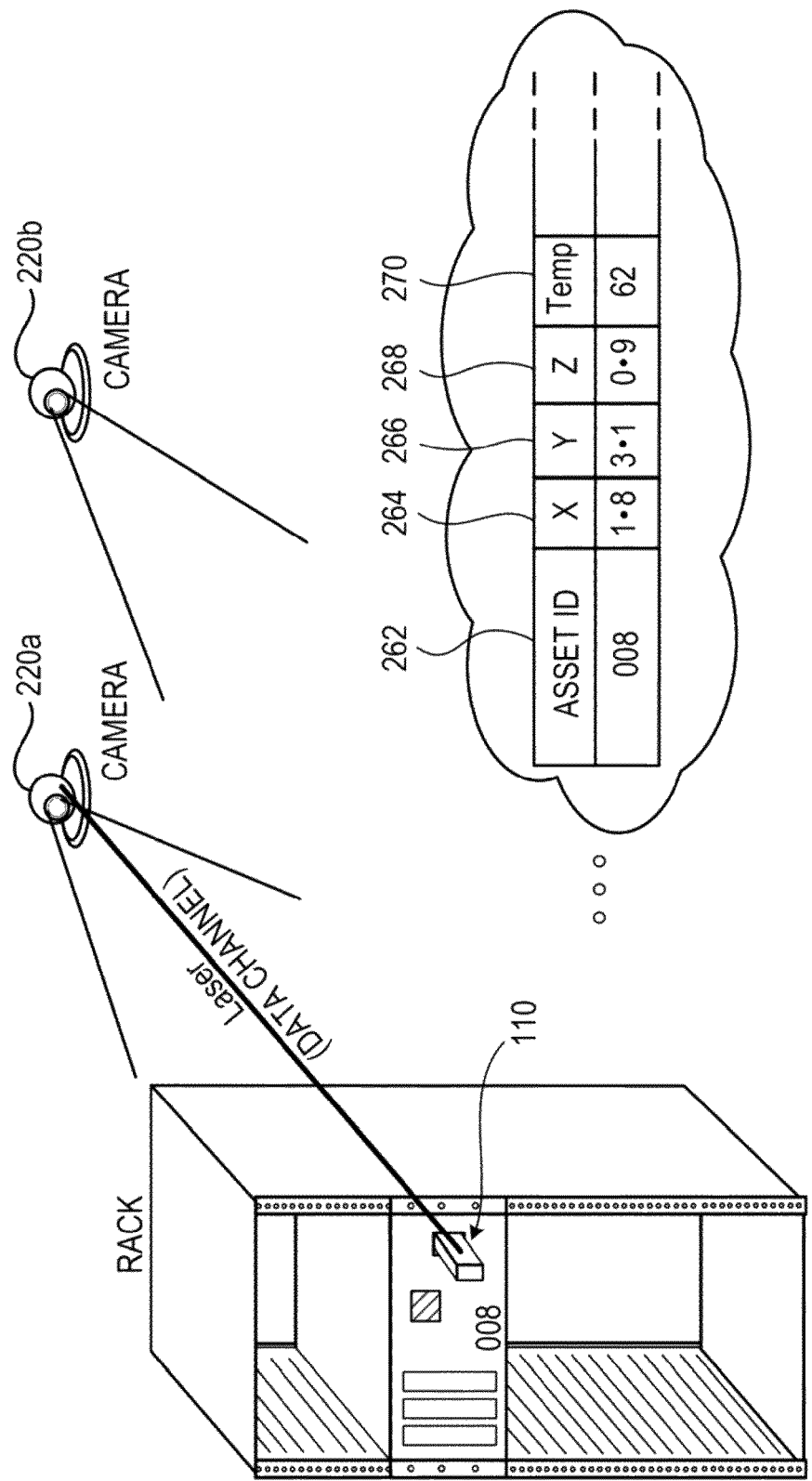
FIG. 2C shows a rack including a plurality of host devices (servers), where each server includes a USB hosted sensor module capable of optical communication in accordance with embodiments of the present invention.

FIGS. 2A, 2B and 2C illustrate three differing configurations and methods of obtaining sensor data (via different communication channels) from the USB hosted sensor modules according to the present invention. In the embodiment shown in FIG. 1A, the USB hosted sensor module 110 includes a microcontroller 116 (or other processing device) capable of supporting multiple communication channels. Having multiple communication channels available provides additional redundancies in the system and because the different communication channels may be connected to devices having different data collection capabilities, the additional communication channel typically offers additional data not available via the alternate channel.

FIG. 2A shows a rack including a plurality of host devices (servers), where each server includes a USB hosted sensor module capable of RF communication in accordance with embodiments of the present invention. Referring to FIG. 2A shows a configuration where the at least one external communication device is a data aggregator 202. Embedded in the data aggregator 202 is an RF wireless subsystem. Specifically, in one embodiment the wireless subsystem is the same (or similar) wireless subsystem 124 shown in the USB hosted sensor 110 in FIG. 1A. In one embodiment, the wireless signal is an RF signal and the communication channel is a wireless communication channel. The embodiment shown in FIG. 1A shows a wireless subsystem (comprised of both an RF transceiver for wireless communications together with an embedded RF antenna) that is used to support RF communications between the USB hosted sensor module 110 and a RF external communication device (not shown in FIG. 1A). In the embodiment shown in FIG. 2A, data is sent from the wireless subsystem 124 of the USB hosted sensor module to a wireless subsystem integrated into a remote data aggregator 202. In FIG. 2A, only the antenna of the wireless sub-system is shown. The antenna 206 for the wireless subsystem is positioned on top of the data aggregator 202.

The data aggregator 202 can either receive or transmit data via the RF communication channel between the aggregator and the USB hosted sensor module 110. The aggregator 202 includes a processing device (not shown) which includes software which allows it to understand the RF protocol and also to listen, collect and store data transmitted from the USB hosted sensor module 110. The software on the data aggregator may in addition have management features as well which provides additional functionality. For example, software in the aggregator could figure out the number of sensor modules that are within its listening range and periodically poll them, if for example, the aggregator doesn't hear from the sensor modules during an expected time frame.

The configuration shown in FIG. 2A includes a second communication channel, a communication channel between the USB hosted sensor module 110 and the host device 134. FIG. 2A shows a rack hosting a plurality of host devices (servers), each server including at least one USB hosted sensor module inserted into a front fascia USB slot. In this case, the external communication device is a data aggregator. The first communication channel is a wireless RF communication channel between the USB hosted sensor module and the data aggregator. The second communication channel is between the USB hosted sensor module 110 and the host device 134. Most times the wired USB link is going to be the most reliable communication channel. However, communication between the sensor module and host device is dependent on the host device being available. If, for example, the host device 134 is unplugged, if the power supply to the host device malfunctions, or if the host software locks-up due to an internal error, then having an alternative communication channel (in this case, the (first) RF wireless communication channel) provides redundancy.

Referring to FIG. 2A, shows a table reflective of data that is collected and stored by the data aggregator. The data values in this and the other tables shown in this application do not reflect actual experimental results, but data that was created for the purposes of example. Referring to the table, the ID column 212 reflects the ID or identification of the USB hosted sensor module. The sensor ID would typically be embedded in the sensor itself. For example, the sensor ID could be pre-programmed in the microcontroller. Referring to the table, column 214 shows the inlet temperature column which is the temperature measured by a temperature sensor of the USB hosted sensor module (which is positioned by the inlet of the host device.) Similarly, column 216 of the table is the inlet humidity which is the humidity value measured by the USB hosted sensor module. Referring to column 218, the IP address is the unique IP address of the host device that the USB hosted sensor module is connected to. The IP address entry of the table only is only available in the data aggregator table, if there is a USB communication channel available (USB sensor module connected to the host device both power and data information is available from the host device).

FIG. 2B shows a rack including a plurality of host devices (servers), where each server includes a USB hosted sensor module capable of both optical and RF communication in accordance with embodiments of the present invention. The USB hosted sensor module 110 according to the present invention includes at least one communication channel to an external communication device. In the embodiment shown in FIG. 2B, the sensor module includes two communication channels, where each communication channel is from the USB hosted sensor module to an external device. The first external communication device is a data aggregator (as previously described with respect to FIG. 2A). A first communication channel (RF) is formed between the wireless subsystem of the USB sensor module and the data aggregator. In the embodiment shown in FIG. 2B, the second external communication device is an optical reader. A second communication channel (optical) is formed between the light emitters and/or detectors of the USB hosted sensor module and the optical readers. Since the RF communication channel was discussed in detail with respect to FIG. 2A, it will not be discussed in detail with respect to FIG. 2A. Instead details of the second communication channel (an optical communication channel) will be discussed in greater detail.

FIG. 2B shows a rack including a plurality of host devices (servers), where each server 134 includes a USB hosted sensor module 110 capable of optical and RF communication in accordance with embodiments of the present invention. For the embodiment shown in FIG. 2B to work, the USB hosted sensor module must include both a wireless subsystem 124 and light emitting and/or receiving devices 120a-c shown in FIG. 1A. Referring to FIG. 2B, in one embodiment the USB hosted sensor module 110 can also illuminate an embedded light source using internal light emitting diodes or another appropriate light source. In one embodiment, this task is performed at the request of the remote data aggregator, using the RF communications channel previously described with respect to FIG. 2A.

Color sequencing or light pattern sequencing may also be used to further differentiate the emitted signals from each USB hosted sensor module. Such light sequences or patterns, emitted by each sensor module 110, can be remotely monitored by an array of fixed or mobile cameras placed within the data center to also determine the location. In one embodiment, time varying light patterns may also be utilized as a low speed data channel. However, these time varying light patterns may be limited by the sampling rate of any remote sensors or imagers.

As with the prior example described with respect to FIG. 2A, a data aggregator 202 is responsible for collecting and processing data from the USB hosted sensor modules. In certain cases, racks with doors may partially block the light being emitted from the USB hosted sensor modules, but in most cases we expect sufficient light to emerge from the rack to enable the USB hosted sensor module to be located to be within a reasonable degree of accuracy—a single USB slot within the rack for example. A further concern with such racks is whether a radio frequency communications path would be attenuated by a metallic door. In such cases, an alternate wired communications pathway, using USB via the host asset, in combination with optical communication channel may be a more practical option for sensed data propagation. If a wired USB path is used, this would add a third communication channel, a wired communication channel between the USB hosted sensor module and the host device.

For the optical communication channel, light detectors 120a-c in the USB hosted sensor module 110 can be used to detect the presence or focus an external light source. In one embodiment, the light emitted from the USB hosted sensor module may also be modulated to send an optically encoded message to the reader (the associated external communication device). Likewise, internal light emitters within the USB hosted sensor module may be used to emit a locating light beacon to the reader. Although the term reader 220*a-b* is used to describe the external communication device to which the optical communication channel is formed, the reader in this application does more than just detect and "read" the optically transmitted signal from the sensor module 110. In one embodiment, the reader (shown as a camera) has the functionality of a camera and includes in addition an external light source (for example, a laser or a collimated light source).

In addition, the reader 220 includes a processing device (not shown) that includes software that allows the reader to read, collect, store, translate and manage optical data. In one embodiment, light emitters 120*a-c* from the USB hosted sensor module can be used to blink a code or status information to the reader 220*a-b*. The reader could also modulate information back to the USB sensor module and then wait until it knows that the reader is focused on it before it sends information back. In one embodiment, the sensor module 110 transmits optical information anticipating that the reader will receive the transmitted information. Alternatively, transmission can be initiated when the USB hosted sensor module receives an indication that the reader is focused on it (you're now in my field of view) before it starts transmitting information.

Referring to FIG. 2B, shows a table reflective of data that is collected and stored by the data aggregator and optical reader. Referring to the table, the ID column 242 reflects the ID or identification of the USB hosted sensor module. In the table XYZ are the coordinates (see reference). Images from camera can be used to calculate (using triangulation) the XYZ coordinates (columns 244, 246, 248). Referring to the table, column 250 shows the inlet temperature column which is the temperature measured by a temperature sensor of the USB hosted sensor module (which is positioned by the inlet of the host device.) Referring to columns 252 and 254 shows the make and model number of the host device that the USB hosted sensor is connected to. Referring to column 256, the IP address is the unique IP address of the host device that the USB hosted sensor module is connected to. The make, model and IP address entries of the table are only available if there is a USB communication channel available (USB sensor module connected to the host device both power and data information is available from the host device).

FIG. 2C a rack including a plurality of host devices (servers), where each server includes a USB hosted sensor module capable of optical communication in accordance with embodiments of the present invention. Referring to FIG. 2C, shows a configuration where the at least one external communication device is the optical reader 220*a-b*. FIG. 2C shows a third potential systems implementation option, a reversed information flow compared to the previous examples where the USB hosted sensor modules themselves are responsible for determining their specific location. In this case, the readers (external camera modules) scan and locate the USB sensor modules and send their own position and orientation data to the asset attached modules. This is achieved by equipping the readers with a collimated light source that can be modulated or encoded with the camera's location and orientation information. This data is decoded by a photo-diode or other embedded light detection device, enabling interpretation of the incoming optical data stream. Thus, once a sensor module has received its relative orientation to, and the location of, at least two readers, it can use geometric triangulation to determine it's own location and hence by reference that of the host device.

Although not illustrated in FIG. 2C, this information can be shared with the host device. For cases where a second communication channel is available (a wired USB communication channel between the USB hosted sensor module and the host device), data can be shared with the host device. In this case location information from the USB hosted sensor module 110 can be propagated to the host asset before being aggregated at the facilities level enabling it to share its location information with the data management software system using iLO or OpenView in the case of Hewlett-Packard based devices. It may also be possible to combine the optical features of the USB hosted sensor modules with the retro-reflective active tag features described in the pending application "Retro-Reflective Optical Tag," having Ser. No. 12/470,348, filed May 21, 2009.

Referring to FIG. 2C, shows a table reflective of data that is collected and stored by the optical reader. Referring to the table, the ID column 262 reflects the ID or identification of the USB hosted sensor module. In the table XYZ are the coordinates (see reference). Images from camera can be used to calculate (using triangulation) the XYZ coordinates (columns 264, 266 and 268). Referring to the table, column 270 shows the inlet temperature column which is the temperature measured by a temperature sensor of the USB hosted sensor module (which is positioned by the inlet of the host device.) The data shown in the table is reflective of data that may be collected solely using an optical communication channel. In one embodiment, the sensor module receives power from the host device via a USB connector, but does not establish a USB communication channel between the USB hosted sensor module and the host device. In an alternative embodiment, two communication channels exist—an optical communication channel and a USB wired communication channel.

Figure 3:
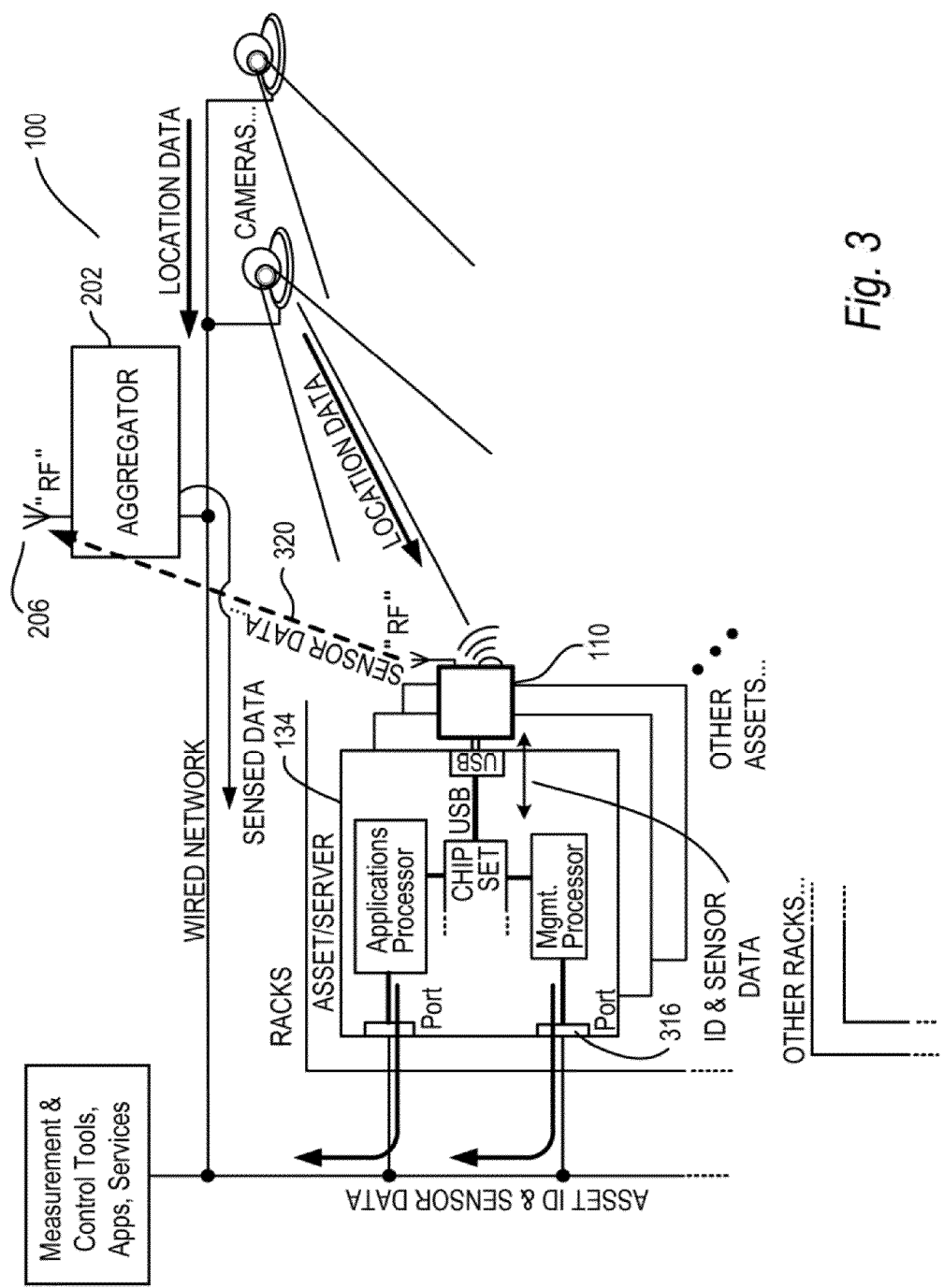
FIG. 3 shows data flow pathways between a USB hosted sensor module connected to a host server and a remote reader in accordance with embodiments of the present invention.

FIG. 3 shows data flow pathways between a USB hosted sensor module connected to a host server 134 and a remote reader (220, 202) in accordance with embodiments of the present invention. FIG. 3 details how the various components could exchange information in a data center deployment. The reader system identifies and determines the location of the USB hosted sensor modules 110*a* using an array of camera based optical readers 220*a-b* as shown. Control of each USB hosted sensor module's light source 120 is feasible via a number of methods. For example, via the iLO interface 316, through a software application executing on each of the host servers, or via a low power wireless data link 320. These links would also be used to propagate sensor data from the modules to the reader system. While all of these data links are not required to create a working solution, they have been shown together in the Figure. Also, as shown, the sensed data pathway 320 (from the USB modules to a centralized control and aggregation unit) could be devised to route through the host assets (via iLO or other application software), thus enabling data concerning the servers operational state to be appended to the sensor and position information.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

It is intended that the scope of the invention be defined by the following claims and their equivalents.

The invention claimed is:

1. A USB hosted sensor module, comprising:
   a substrate;
   a sensor mounted on the substrate; and
   a USB connector mounted on the substrate, the USB connector capable of electrically coupling to a USB port of a host device, the USB connector capable of drawing power from the USB port of the host device to provide electrical power to the USB hosted sensor module; and
   a processing device mounted on the substrate, the processing device capable of supporting a first communication channel and a second communication channel, wherein the first communication channel is between the USB hosted sensor module and at least one external communication device, wherein the second communication channel is between the USB hosted sensor module and the host device, wherein the at least one external communication device is an optical reading device and the first communication channel is an optical communication device.

2. The USB hosted sensor module recited in claim 1 wherein the USB hosted sensor module further includes light emitting devices.

3. The USB hosted sensor module recited in claim 2, wherein the USB hosted sensor module further includes light receiving devices.

4. The USB hosted sensor module recited in claim 1, including both a first optical communication channel and a second optical communication channel, wherein a first optical communication channel exists between a first optical reading device and the light emitting device of the USB hosted sensor module and a second optical communication channel exists between the USB hosted sensor module and a second optical reading device.

5. The USB hosted sensor module recited in claim 4, wherein the location of the USB hosted sensor module is calculated using triangulation.

6. The USB hosted sensor module recited in claim 1 wherein information about the host device is communicated from the host device to the external communication device via the USB hosted sensor module.

7. A USB hosted sensor module, comprising:
   a substrate;
   a sensor mounted on the substrate; and
   a USB connector mounted to the substrate, the USB connector capable of electrically coupling to a USB port of a host device, the USB connector capable of drawing power from the USB port of the host device to provide electrical power to the USB hosted sensor module; and
   a processor mounted on the substrate, the processor capable of supporting an optical communication channel between a light emitting device on the USB hosted sensor module and an external optical reading device.

8. The USB hosted sensor module recited in claim 7 further including a wireless subsystem mounted to the substrate.

9. The USB hosted sensor module recited in claim 8 further including a wireless communication channel between the USB hosted sensor module and an external wireless communication device.

10. The USB hosted sensor module recited in claim 7 further including a wired USB communication channel between the USB hosted sensor module and the host device.

11. The USB hosted sensor module recited in claim 9 further including a wired USB communication channel between the USB hosted sensor module and the host device.

12. The USB hosted sensor module recited in claim 7 wherein the USB hosted sensor module further includes light receiving devices.

13. The USB hosted sensor module recited in claim 12, including both a first optical communication channel and a second optical communication channel, wherein a first optical communication channel exists between a first optical reading device and the light emitting device of the USB hosted sensor module and a second optical communication channel exists between the USB hosted sensor module and the a second optical reading device.

14. The USB hosted sensor module recited in claim 13, wherein the location USB hosted sensor module is calculated using triangulation.

* * * * *

UNITED STATES PATENT AND TRADEMARK OFFICE
CERTIFICATE OF CORRECTION

| | | |
|---|---|---|
| PATENT NO. | : 8,390,454 B2 | Page 1 of 1 |
| APPLICATION NO. | : 12/534028 | |
| DATED | : March 5, 2013 | |
| INVENTOR(S) | : Geoff M. Lyon et al. | |

It is certified that error appears in the above-identified patent and that said Letters Patent is hereby corrected as shown below:

In the Claims:

In column 10, line 37, in Claim 13, delete "the a" and insert -- a --, therefor.

In column 10, line 39, in Claim 14, delete "location" and insert -- location of the --, therefor.

Signed and Sealed this
Twentieth Day of August, 2013

Teresa Stanek Rea
*Acting Director of the United States Patent and Trademark Office*